(12) United States Patent
Ito et al.

(10) Patent No.: US 7,692,527 B2
(45) Date of Patent: Apr. 6, 2010

(54) COMMON MODE CHOKE COIL

(75) Inventors: Tomokazu Ito, Tokyo (JP); Takeshi Okumura, Tokyo (JP); Toshio Tomonari, Tokyo (JP)

(73) Assignee: TDK Corporation, Tokyo (JP)

( * ) Notice: Subject to any disclaimer, the term of this patent is extended or adjusted under 35 U.S.C. 154(b) by 12 days.

(21) Appl. No.: 12/120,224

(22) Filed: May 13, 2008

(65) Prior Publication Data

US 2008/0290977 A1    Nov. 27, 2008

(30) Foreign Application Priority Data

May 21, 2007    (JP)    .............................. 2007-134159

(51) Int. Cl.
*H01F 5/00*    (2006.01)
*H01F 27/28*    (2006.01)

(52) U.S. Cl. ........................ 336/200; 336/223; 336/232; 336/184; 336/83

(58) Field of Classification Search ........................ None
See application file for complete search history.

(56) References Cited

U.S. PATENT DOCUMENTS

| | | | |
|---|---|---|---|
| 6,181,232 B1 * | 1/2001 | Kitamura | 336/200 |
| 6,618,929 B2 * | 9/2003 | Kitamura | 29/602.1 |
| 6,710,694 B2 * | 3/2004 | Matsuta et al. | 336/200 |
| 7,453,343 B2 * | 11/2008 | Ito et al. | 336/200 |
| 2005/0181684 A1 * | 8/2005 | Ito et al. | 439/894 |
| 2005/0253677 A1 * | 11/2005 | Ito et al. | 336/200 |
| 2006/0097835 A1 * | 5/2006 | Tomonari et al. | 336/200 |
| 2006/0176138 A1 * | 8/2006 | Ito et al. | 336/200 |

FOREIGN PATENT DOCUMENTS

| | | |
|---|---|---|
| JP | 08-203737 | 8/1996 |
| JP | 08203737 | 8/1996 |
| JP | 2002-299149 | 10/2002 |
| JP | 2003-077740 | 3/2003 |
| JP | 206-140229 | 6/2006 |
| JP | 2006140229 | 6/2006 |
| JP | 2006186210 | 7/2006 |

OTHER PUBLICATIONS

Office Action of Apr. 21, 2009 in counterpart JP Application 2007-134159, citing 2006-140229; 2003-077740; 08-203737 and 2002-299149 (3 pages).

* cited by examiner

*Primary Examiner*—Elvin G Enad
*Assistant Examiner*—Mangtin Lian
(74) *Attorney, Agent, or Firm*—Young Law Firm, P.C.

(57) ABSTRACT

A common mode choke coil is provided with first and second coil conductors that are magnetically coupled to each other, a third coil conductor that is electrically connected in series to the first coil conductor and substantially not magnetically coupled to the first coil conductor, a fourth coil conductor that is electrically connected in series to the second coil conductor and substantially not magnetically coupled to the second coil conductor, a first contact conductor for connecting the third coil conductor with the inner end of the first coil conductor, and a second contact conductor for connecting the fourth coil conductor with the inner end of the second coil conductor. The third coil conductor and the fourth coil conductor are substantially not magnetically coupled, and are in a linear symmetrical relationship based on a prescribed center line.

16 Claims, 10 Drawing Sheets

COMMON MODE CHOKE COIL

CROSS-REFERENCE TO RELATED APPLICATIONS

This application claims foreign priority under 35 U.S.C. §119(a)-(d) of Japanese Patent Application No. 2007-134-159, filed May 21, 2007, which application is hereby incorporated herein by reference in its entirety.

TECHNICAL FIELD

The present invention relates to a common mode choke coil, and particularly relates to a common mode choke coil provided with characteristic impedance adjustment coils.

BACKGROUND OF THE INVENTION

A differential transmission system is known as one of the transmission systems for transmitting a digital signal between electronic devices. The differential transmission system is a system in which digital signals each having opposite phases are inputted in a single pair of signal lines, and external noise generated from the signal lines or radiation noise is cancelled out through differential transmission. Since noise is reduced by the cancellation of external noise, a signal can be transmitted at a low amplitude. This system has further advantages in that the amplitude of the signal is reduced, the rising and falling time of the signal are reduced, and the speed of signal transmission can therefore be increased.

Interface specifications that use this differential transmission system include USB (Universal Serial Bus), IEEE1394, LVDS (Low Voltage Differential Signaling), DVI (Digital Video Interface), HDMI (High-Definition Multimedia Interface), and other specifications. Among these specifications, HDMI is a high-speed digital interface that enables more digital signals to be transmitted, and that enables uncompressed digital signals to be transmitted between a source device (e.g., a DVD player, a set-top box, or the like) and a sink device (e.g., a digital television, a projector, or the like). According to HDMI, video signals and audio signals can be transmitted at high speed by a single HDMI cable.

A common mode choke coil is used as a noise suppressor in a high-speed differential transmission line. Although a differential transmission system has the characteristics of strong external noise suppression and no generation of noise, common mode noise is actually generated by slight imbalances of the two signals, and such noise is emitted from interface cables and the like. A common mode choke coil is most effective at removing this noise. Small-sized, high-performance thin-film-type common mode choke coils have been preferred for use, particularly in recent times (see Japanese Laid-open Patent Application No. H08-203737).

In HDMI and other high-speed interfaces, the structure of the ICs as such has become vulnerable to ESD (Electrostatic Discharge) as speed has been increased. Therefore, the need for ESD protection in high-speed transmission ICs is increasing, and varistors, Zener diodes, and other capacitive elements are used as ESD protection components.

However, when a capacitive element is inserted as an ESD protection component in a transmission channel, drawbacks occur in that the signals transmitted through the transmission channel, particularly high-frequency signals (200 MHz or higher) or high-speed pulse signals, are reflected and attenuated. The reason for this is that when a capacitive element is inserted in the transmission channel, the characteristic impedance in the position at which the capacitive element is inserted is reduced by the capacitance component of the capacitive element, and the impedance is mismatched at the insertion position. When there is a portion of the transmission channel in which the impedance is mismatched, the high-frequency component of the signal causes reflection in the impedance-mismatched portion, and return loss therefore occurs. As a result, the signal is significantly attenuated. The reflection also sometimes causes unwanted radiation in the transmission channel, which causes noise. In HDMI, the specified value (TDR specification) of the characteristic impedance of the transmission line is $100\Omega\pm15\%$ (High-Definition Multimedia Interface Specification Version 1.1).

As a result of concentrated investigation of signal transmission circuits capable of suppressing a reduction in the characteristic impedance even when a capacitive element is used for ESD protection, the inventors discovered that a reduction of characteristic impedance is effectively suppressed by providing a common mode choke coil, and an inductor that is substantially not magnetically coupled with an inductor included in the common mode choke coil, in a state in which the common mode choke coil and the inductor are connected in series to each other in a stage prior to a capacitive element. Furthermore, including a characteristic impedance adjustment coil in the common mode choke coil makes it possible to reduce the number of components, lower the cost, and enhance reliability (see Japanese Laid-open Patent Application No. 2006-140229).

However, merely adding a characteristic impedance adjustment coil to the common mode choke coil is inadequate, and there is a need for a characteristic impedance adjustment coil having satisfactory characteristics in which there is minimal fluctuation in the inductor values of two characteristic impedance adjustment coils, and in which magnetic coupling between inductors is adequately suppressed.

SUMMARY OF THE INVENTION

The present invention overcomes the abovementioned drawbacks, and an object of the present invention is to provide a common mode choke coil that is provided with a characteristic impedance adjustment coil having satisfactory inductance characteristics.

The above and other objects of the present invention can be accomplished by a common mode choke coil comprising first and second coil conductors that are magnetically coupled to each other; a third coil conductor that is electrically connected in series to the first coil conductor and substantially not magnetically coupled to the first coil conductor; and a fourth coil conductor that is electrically connected in series to the second coil conductor and substantially not magnetically coupled to the second coil conductor; wherein the third coil conductor and the fourth coil conductor are substantially not magnetically coupled, and are in a linear symmetrical relationship based on a prescribed center line.

According to the present invention, since the third coil conductor and the fourth coil conductor have the same shape and are in a linear symmetrical relationship, fluctuation in the inductance of the third coil conductor and the fourth coil conductor can be reduced, and reduction of the characteristic impedance can be reliably suppressed. In the present invention, the state of being substantially magnetically coupled is a state in which the coupling coefficient is 0.9 or higher. The state of being substantially not magnetically coupled is a state in which the coupling coefficient is 0.1 or lower.

The common mode choke coil of the present invention preferably further comprises a first contact conductor for connecting the third coil conductor with an inner end of the first coil conductor; and a second contact conductor for connecting the fourth coil conductor with an inner end of the second coil conductor; wherein the first contact conductor and the second contact conductor have a linear symmetrical relationship based on a prescribed center line. The first contact conductor is also preferably connected to an inner end of the third coil conductor, and the second contact conductor is preferably connected to an inner end of the fourth coil conductor.

Due to the fact that a contact hole that passes through an insulation layer is formed near the inner ends of the first and second coil conductors, there is a portion in which the coil conductors are not superposed on each other. The inner ends of the first and second coil conductors must be connected to a terminal electrode through a contact conductor formed in another layer, and the wiring length to the terminal electrode therefore naturally increases. In other words, this portion is one in which the magnetic coupling of the two coil conductors significantly decreases. In the present invention, since the third and fourth coil conductors are provided in such a portion in which the magnetic coupling significantly decreases, magnetic coupling between the first and second coil conductors and the third and fourth coil conductors can be reliably suppressed. The first and second contact conductors are also in a linear symmetrical relationship, fluctuation of the inductance of the first and second coil conductors can therefore be reduced, and reduction of the characteristic impedance can be further suppressed.

In the present invention, the first contact conductor and the second contact conductor are preferably provided in the same layer. Since the first and second contact conductors can thereby be formed at the same time using the same mask, the shape and positioning of the first and second contact conductors can be properly matched, and fluctuation of the inductance can be reliably prevented.

In the present invention, the third coil conductor and the fourth coil conductor are preferably provided in the same layer. Since the third and fourth coil conductors can thereby be formed at the same time using the same mask, the shape and positioning of the third and fourth coil conductors can be properly matched, and fluctuation of the inductance can be reliably prevented.

In the present invention, any one of the first and second coil conductors is preferably provided in the same layer as the third and fourth coil conductors. The thickness of the third and fourth coil conductors can thereby be made the same as that of the first and second coil conductors.

In the present invention, a shortest distance between the third coil conductor and the fourth coil conductor is preferably set to three or more times the pitch of the third and fourth coil conductors. Magnetic coupling between the third coil conductor and the fourth coil conductor can thereby be reliably suppressed.

In the present invention, the second coil conductor is preferably formed in the upper layer than the first coil conductor, and the width of the second coil conductor is preferably less than the width of the first coil. The coil conductor 17 is thereby formed in a position that is always separated from the edge portion of the coil conductor 16 via an insulation layer, and the insulation withstand voltage can therefore be enhanced.

In the present invention, a directional mark formed on a side surface of the common mode choke coil main body is preferably furthermore provided. In this case, it is furthermore preferred that the directional mark be a conductor pattern that is provided in the same layer as any of the first through fourth coil conductors and the first and second contact conductors. The effects of the third and fourth coil conductors may be slightly reduced when the common mode choke coil of the present invention is packaged in a wrong orientation, but providing such a directional mark makes it possible to clearly define the orientation of the common mode choke coil body and to prevent the common mode choke coil from being packaged in a wrong orientation. When the directional mark is formed together with the first through fourth coil conductors, or together with the first and second contact conductors, the directional mark can be formed without the use of specialized processes such as printing or laser processing.

BRIEF DESCRIPTION OF THE DRAWINGS

The above and other objects, features and advantages of this invention will become more apparent by reference to the following detailed description of the invention taken in conjunction with the accompanying drawings, wherein.

DESCRIPTION OF THE PREFERRED EMBODIMENTS

Preferred embodiments of the present invention will now be described in detail hereinafter with reference to the accompanying drawings.

Figure 1:
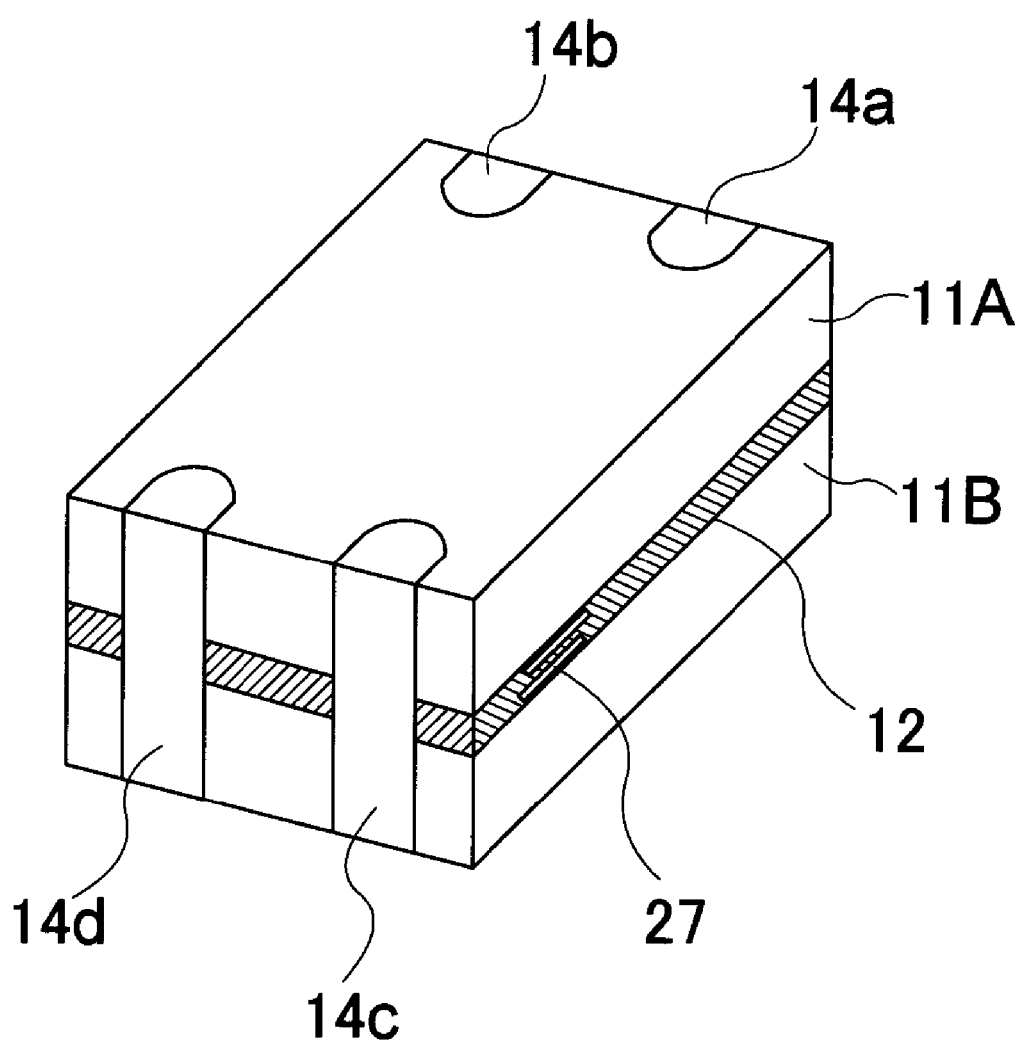
FIG. 1 is a schematic perspective view showing the structure of a common mode choke coil according to a first embodiment of the present invention.

FIG. 1 is a schematic perspective view showing a structure of a common mode choke coil 100 according to the first embodiment of the present invention.

As shown in FIG. 1, the common mode choke coil 100 is a thin-film type coil, and is provided with first and second magnetic substrates (magnet layers) 11A, 11B and a layer assembly 12 interposed between the first magnetic substrate 11A and the second magnetic substrate 11B. Terminal electrodes 14a through 14d are formed in the external peripheral surface of a layered body composed of the first magnetic substrate 11A, the layer assembly 12, and the second magnetic substrate 11B. A directional mark 27 described in detail hereinafter is also formed on the side surface of the common mode choke coil 100.

The first and second magnetic substrates 11A, 11B physically protect the layer assembly 12 and serves as a closed magnetic circuit of the common mode choke coil. Sintered ferrite, composite ferrite (a resin containing powdered ferrite), or the like may be used as the material of the first and second magnetic substrates 11A, 11B.

Figure 2:
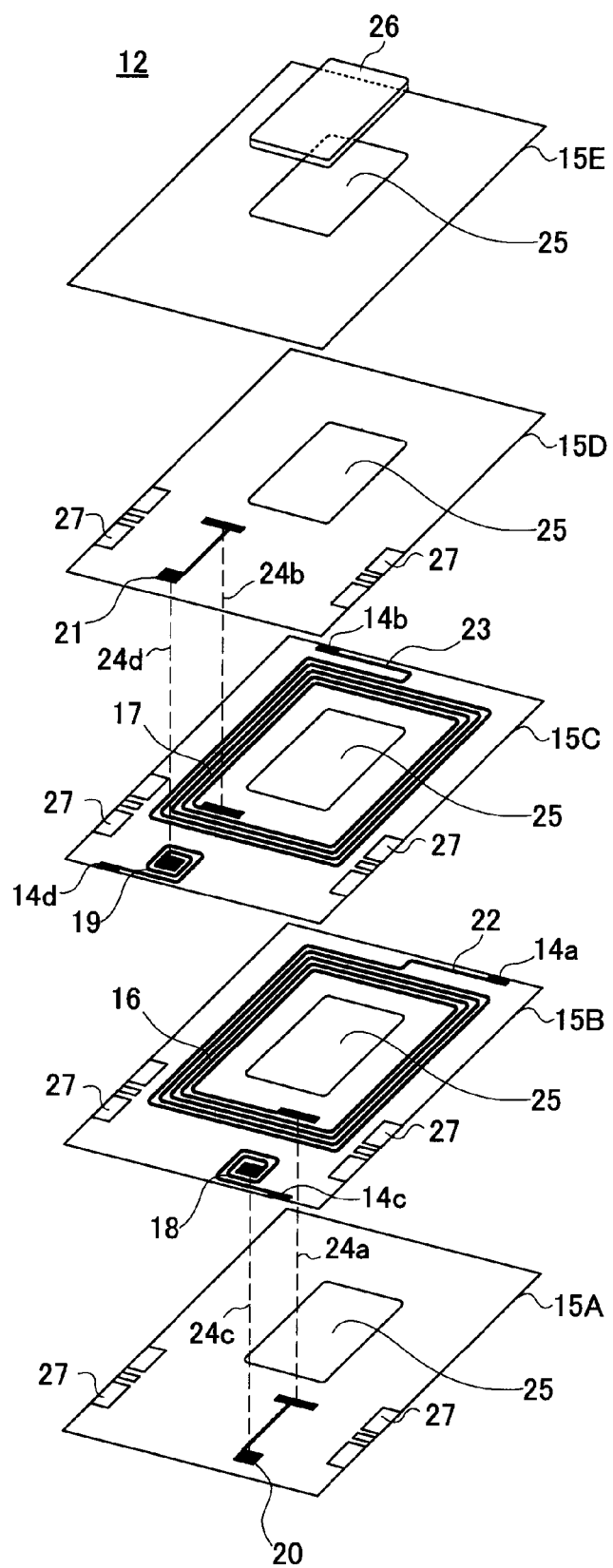
FIG. 2 is a schematic exploded perspective view showing a layer assembly.

FIG. 2 is a schematic exploded perspective view showing the layer assembly 12.

As shown in FIG. 2, the layer assembly 12 is obtained by forming a plurality of layers into a layered formation by a thin-film molding technique. The layer assembly 12 has first through fifth insulation layers 15A through 15E; first and second coil conductors 16, 17 that function as the actual common mode choke coil; third and fourth coil conductors 18, 19 that are characteristic impedance adjustment coils; first and second contact conductors 20, 21; and first and second extraction conductors 22, 23. The layer assembly 12 of the present embodiment has four conduction layers provided between the first through fifth insulation layers 15A through 15E.

The first through fifth insulation layers 15A through 15E provide insulation between the conductor patterns, or between the conductor patterns and the magnetic substrates, and maintain flatness of the plane in which the conductor patterns are formed. The first and fifth insulation layers 15A and 15E in particular moderate surface irregularity of the first and second magnetic substrates 11A, 11B and increase the adhesion of the conductor patterns. The insulation layers 15A through 15E are preferably formed using polyimide resin, epoxy resin, or another highly workable resin material that has excellent electrical and magnetic insulation properties. Although not particularly limited, the thickness of the first through fifth insulation layers is preferably set to 0.1 to 10 μm.

An opening 25 that passes through the first through fifth insulation layers 15A through 15E is provided in the center region inside the first and second coil conductors 16, 17. A magnetic body 26 for forming a closed magnetic circuit between the first magnetic substrate 11A and the second magnetic substrate 11B is provided in the opening 25. Composite ferrite or another magnetic material may be used as the magnetic body 26.

The first coil conductor 16 is provided on the second insulation layer 15B. The first coil conductor 16 is composed of Cu or another metal material, and has a spiral shape. The inner end of the spiral of the first coil conductor 16 is connected to one end of the first contact conductor 20 via a contact hole 24a that passes through the second insulation layer 15B. The outer end of the spiral of the first coil conductor 16 is connected to the abovementioned terminal electrode 14a via the first extraction conductor 22.

The second coil conductor 17 is provided on the third insulation layer 15C. The second coil conductor 17 is also composed of Cu or another metal material, and has the same spiral shape as the first coil conductor 16. Since the second coil conductor 17 is provided in the same position as the first coil conductor 16, and is completely superposed on the first coil conductor 16, a strong magnetic coupling occurs between the first coil conductor 16 and the second coil conductor 17. The inner end of the spiral of the second coil conductor 17 is connected to one end of the second contact conductor 21 via a contact hole 24b that passes through the fourth insulation layer 15D. The outer end of the spiral of the second coil conductor 17 is connected to the abovementioned terminal electrode 14b via the second extraction conductor 23.

The third coil conductor 18 is provided on the second insulation layer 15B in the same manner as the first coil conductor 16. The inner end of the third coil conductor 18 is connected to the other end of the first contact conductor 20 via a contact hole 24c that passes through the second insulation layer 15B. Specifically, the third coil conductor 18 is connected in series to the first coil conductor 16 via the first contact conductor 20. The outer end of the third coil conductor 18 spiral is also connected to a terminal electrode 14c.

The fourth coil conductor 19 is provided on the third insulation layer 15C in the same manner as the second coil conductor 17. The inner end of the fourth coil conductor 19 is connected to the other end of the second contact conductor 21 via a contact hole 24d that passes through the third insulation layer 15C. Specifically, the fourth coil conductor 19 is connected in series to the second coil conductor 17 via the second contact conductor 21. The outer end of the fourth coil conductor 19 spiral is connected to a terminal electrode 14d.

Figure 3:
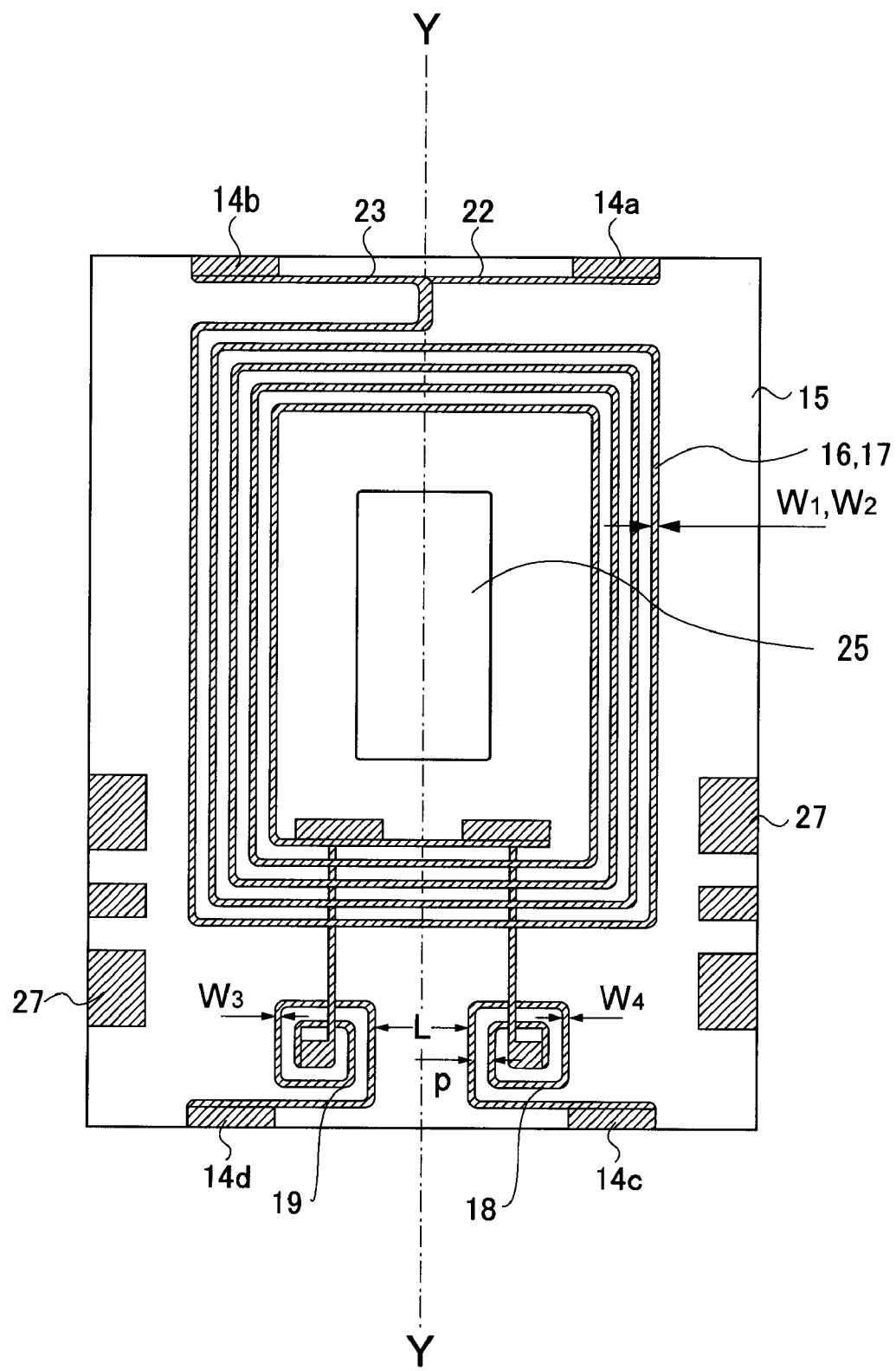
FIG. 3 is a schematic plan view showing the superposition of all the conductor patterns in the layer assembly.

FIG. 3 is a schematic plan view showing the superposition of all the conductor patterns in the layer assembly 12.

As shown in FIG. 3, the planar positions of the third and fourth coil conductors 18, 19 are in a linear symmetrical relationship based on a center line (line Y-Y in FIG. 3) in the longitudinal direction of the common mode choke coil 100, and the spiral shape is also linearly symmetrical. Since the third and fourth coil conductors 18, 19 thus have a linear symmetrical relationship, the lengths of the two coil conductors can be correctly matched, and fluctuation of the inductance can be adequately reduced.

The shortest distance L between the third coil conductor 18 and the fourth coil conductor 19 is preferably set to three or more times the pitch p of the coil conductors 18, 19. Magnetic coupling between the third coil conductor 18 and the fourth coil conductor 19 can thereby be reliably prevented.

The widths of the first through fourth coil conductors 16 through 19 are preferably set to from 1 to 25 μm. The reason for this is that the chip increases in size, and the capacitance component increases, when the conductor width is too great, whereas the direct-current resistance increases when the conductor width is too small. The first through fourth coil conductors 16 through 19 may all have the same width, or the first and second coil conductors 16, 17 may have a different width than the third and fourth coil conductors 18, 19. Widths $W_3$, $W_4$ of the third and fourth coil conductors 18, 19 are preferably less than widths $W_1$, $W_2$ of the first and second coil conductors 16, 17. According to this, small inductors for adjusting the characteristic impedance can be made without occupying large area. Furthermore, the width $W_2$ of the second coil conductor 17 may be less than the width $W_1$ of the first coil conductor 16. The reasons for adopting such a structure are described below.

When the coil conductors 16, 17 have the same width, the insulation layer at the edge portion easily undergoes localized reduction in thickness when an insulating resin is applied to certain irregular portions of the coil conductor 16 to form an insulation layer between the coil conductors. If misalignment were to occur between the coil conductors 16, 17, shorting would easily occur between the coil conductors 16, 17 in edge portions in which potential differences and electrolytic concentration occur between the coil conductors 16, 17. However, when the width $W_2$ of the second coil conductor 17 is less than the width $W_1$ of the first coil conductor 16, the coil conductor 17 is always formed in a position that is separated from the edge portions of the coil conductor 16, and the insulation withstand voltage can therefore be enhanced.

Although not particularly limited, the spiral pitch of the first through fourth coil conductors 16 through 19 is preferably set to from 1 to 25 µm. The reason for this is that although the pitch is set in relation to the width of the coil conductors, shorting easily occurs when the pitch is too narrow, and the inductance characteristics are adversely affected when the pitch is too wide. The first through fourth coil conductors 16 through 19 may all have the same pitch, or the pitch of the first and second coil conductors 16, 17 may differ from the pitch of the third and fourth coil conductors 18, 19.

The thickness of the first through fourth coil conductors 16 through 19 is preferably set to 1 to 25 µm. The reason for this is that the overall thickness of the layer assembly 12 cannot be reduced when the conductors are too thick, and the direct-current resistance decreases when the conductors are too thin. The first through fourth coil conductors 16 through 19 may all have the same thickness, or the first and second coil conductors 16, 17 may have a different thickness than the third and fourth coil conductors 18, 19.

The width or thickness of the first and second contact conductors 20, 21 may be the same as, or different than, that of the first through fourth coil conductors 16 through 19. The first and second contact conductors 20, 21 in particular are formed in a different layer than the first through fourth coil conductors 16 through 19, and can therefore have a smaller thickness than the coil conductors 16 through 19. In contrast, the first and second extraction conductors 22, 23 are formed at the same time in the same layer as the first and second coil conductors 16, 17, are subject to limitations in the manufacturing process, and therefore have the same thickness as the coil conductors 16, 17.

The first and second contact conductors 20, 21 are preferably in a symmetrical relationship based on the center line Y-Y in FIG. 3. Therefore, fluctuation of the inductance of the first and second coil conductors 16, 17 can be further reduced, and reduction of the characteristic impedance can be further suppressed.

In the common mode choke coil 100 according to the present embodiment thus configured, the first coil conductor 16 and the third coil conductor 18 are connected to each other at the inner end, and the second coil conductor 17 and the fourth coil conductor 19 are also connected to each other at the inner end. The reason for this is that unlike the external peripheral side, the internal peripheral side of the first and second coil conductors 16, 17 must be drawn out to the other layer via the contact holes 24a, 24b that pass through the insulation layer, the wiring length to the terminal electrodes therefore necessarily increases, and the effects of magnetic coupling are reduced.

In other words, since the extraction conductors 22, 23 formed in the same layer are used for the connection between the external peripheral side of the first and second coil conductors 16, 17 and the terminal electrodes 14a, 14b, the wiring length to the terminal electrodes decreases, and the effects of magnetic coupling are therefore relatively strong in the connection region. In contrast, the internal peripheral side of the first and second coil conductors 16, 17 and the terminal conductors 14c, 14d must be connected via the contact conductors 20, 21 formed in another layer, the wiring length to the terminal electrodes therefore increases, and the effects of magnetic coupling are relatively weak in the connection region. Accordingly, the effects of magnetic coupling are reduced by providing the third and fourth coil conductors 18, 19 to this region.

Magnetic coupling between the first and second coil conductors 16, 17 and the third and fourth coil conductors 18, 19 can thereby be reliably prevented. Since the third coil conductor 18 and the fourth coil conductor 19 also have the same shape and are in a linear symmetrical relationship, fluctuation of the inductance of the third coil conductor 18 and the fourth coil conductor 19 can be reduced, and reduction of the characteristic impedance can be reliably suppressed.

A directional marking semiconductor pattern (hereinafter referred to as a "directional mark") 27 is formed in a prescribed position of the external peripheral part of the insulation layers. The directional mark 27 is provided to specify the orientation of the common mode choke coil 100. A detailed description will be given below, but since differences occur in the effects of the characteristic impedance adjustment inductor according to the orientation in which the common mode choke coil is connected, and it is important that the directional mark is provided in advance so that the common mode choke coil is mounted in the correct orientation. In the present embodiment, the directional mark 27 is provided on the first through fourth insulation layers 15A through 15D. The directional mark is formed at the same time as another conductor pattern formed in the same layer, is composed of the same material as the other conductor pattern, and has the same thickness as the other conductor pattern. The end part of the directional mark formed in this manner is exposed on the side of the common mode choke coil body, and the orientation of the common mode choke coil can therefore be confirmed.

The conductor patterns on the insulation layers may be formed by forming a conductor thin film on substantially the entire surface of an insulation layer, and then patterning the conductor thin film. The conductor pattern may be formed by a process in which a resist film is formed after a base conductor film is formed, and then a pattern corresponding to the conductor pattern is formed on the resist film by photolithography, and a conductive metal material is deposited in the resist by electroplating. The resist film used as a pattern and the exposed base conductor film are then removed.

As described above, the two coil conductors that constitute the characteristic impedance adjustment coil are symmetrical to each other according to the present embodiment. Therefore, it is possible to form a common mode choke coil that has satisfactory characteristics, no fluctuation in the two inductor values, and adequate suppression of magnetic coupling between the inductors.

Figure 4:
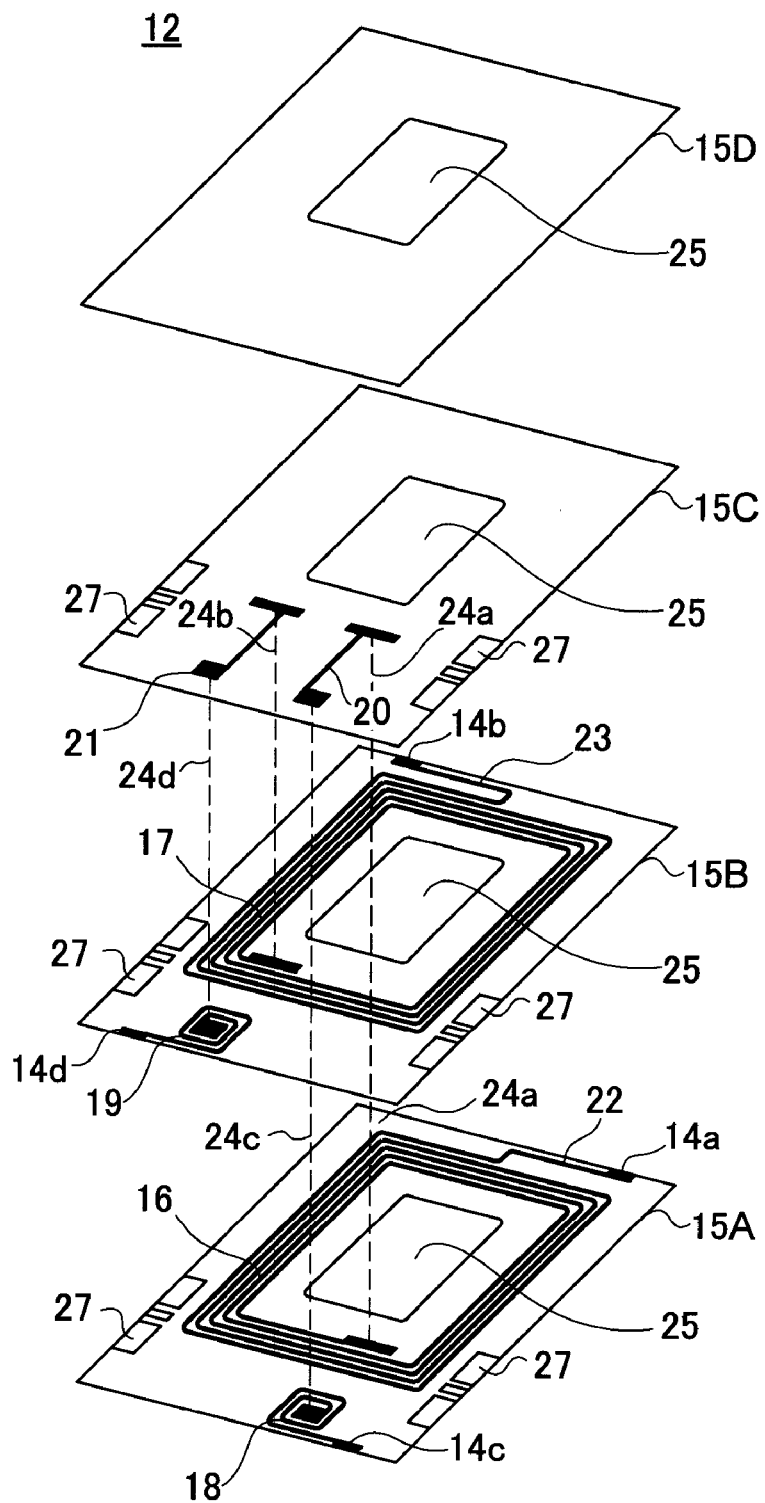
FIG. 4 is a schematic exploded perspective view showing a structure of a common mode choke coil according to a second embodiment of the present invention.

FIG. 4 is a schematic exploded perspective view showing the structure of the common mode choke coil 200 according to second embodiment of the present invention, and shows the detailed structure of the layer assembly 12. Therefore, the magnetic substrates 11A, 11B and the magnetic body 26 in FIG. 4 are omitted.

As shown in FIG. 4, the characteristic features of the common mode choke coil 200 are that the common mode choke coil 200 has a three-layer layer assembly 12, and that the first contact conductor 20 and the second contact conductor 21 are both formed on the third insulation layer 150. The first coil conductor 16 and the third coil conductor 18 are formed on the first insulation layer 15A, and the second coil conductor 17 and the fourth coil conductor 19 are formed on the second insulation layer 15B. Since the other structural aspects are the same as in first embodiment, the same symbols are used to refer to the constituent elements that are the same in both embodiments, and no detailed description thereof will be given. According to the present embodiment, since the first contact conductor 20 and the second contact conductor 21 are provided in the same layer, one of the insulation layers can be omitted, and a common mode choke coil having a smaller thickness can be formed.

Figure 5:
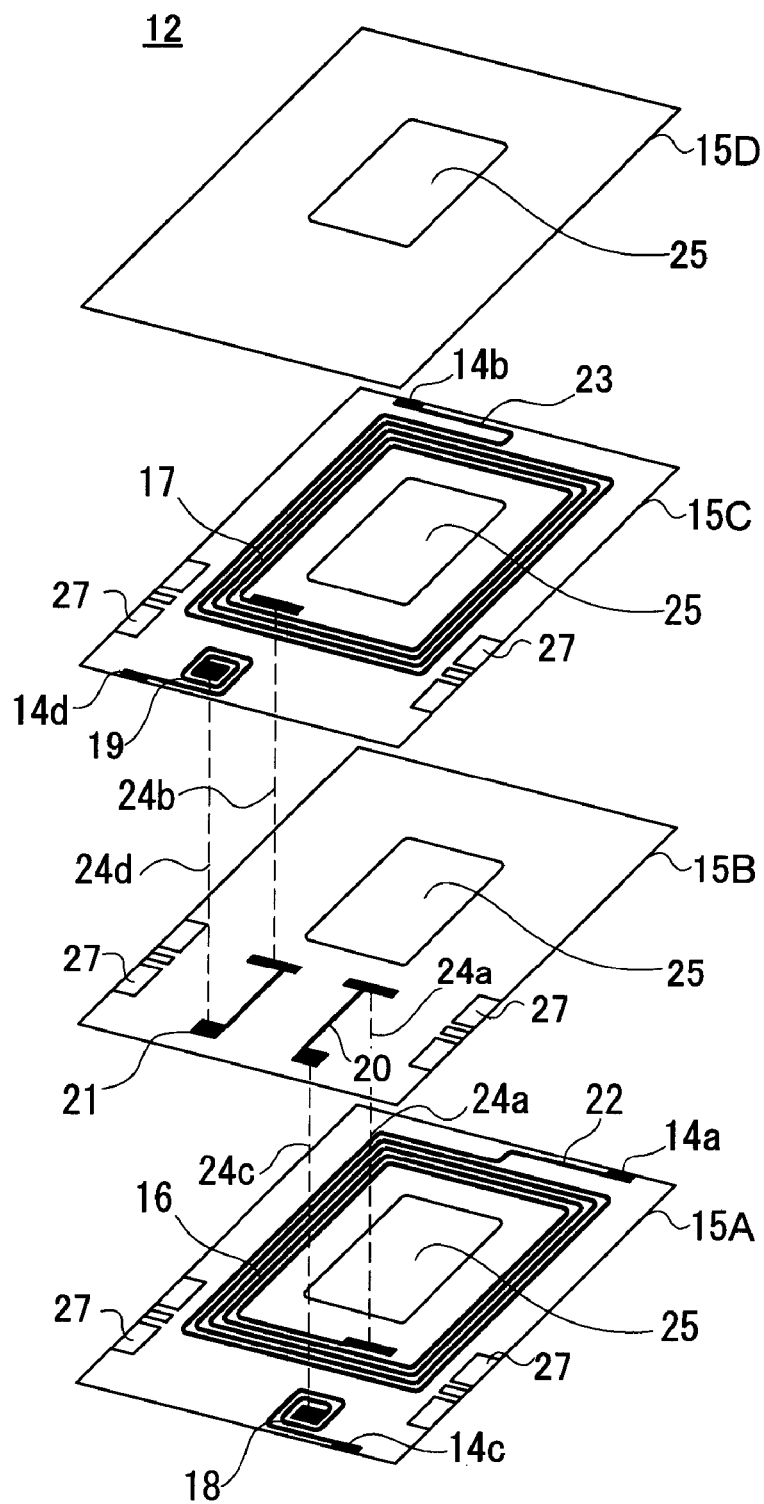
FIG. 5 is a schematic exploded perspective view showing a structure of a common mode choke coil according to a third embodiment of the present invention.

FIG. 5 is a schematic exploded perspective view showing the structure of the common mode choke coil 300 according to third embodiment of the present invention, and shows the detailed structure of the layer assembly 12. Therefore, the magnetic substrates 11A, 11B and the magnetic body 26 in FIG. 5 are omitted.

As shown in FIG. 5, the characteristic features of the common mode choke coil 300 are that the common mode choke coil 300 has a three-layer layer assembly 12, and that the first contact conductor 20 and the second contact conductor 21 are both formed on the second insulation layer 15B. In other words, the first and second contact conductors 20, 21 are formed between the coil layers. Since the other structural aspects are the same as in first embodiment, the same symbols are used to refer to the constituent elements that are the same in both embodiments, and no detailed description thereof will be given. According to the present embodiment, one of the insulation layers can be omitted, and a common mode choke coil having a smaller thickness can be formed, the same as in second embodiment. Furthermore, the contact holes 24a, 24b have the same length as the contact holes 24c, 24d, and inductance fluctuation can therefore be further reduced.

Figure 6:
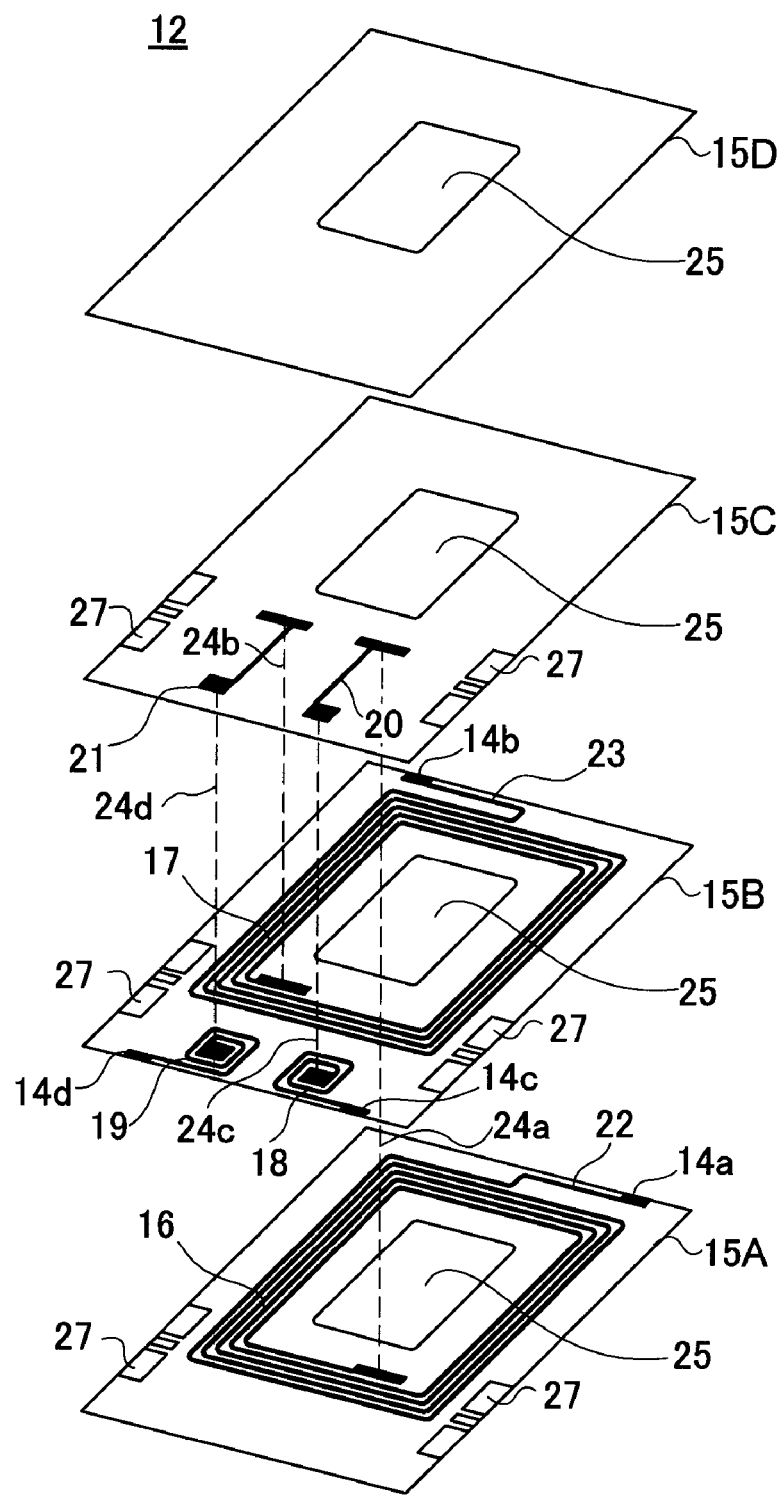
FIG. 6 is a schematic exploded perspective view showing a structure of a common mode choke coil according to a fourth embodiment of the present invention.

FIG. 6 is a schematic exploded perspective view showing the structure of the common mode choke coil 400 according to fourth embodiment of the present invention, and shows the detailed structure of the layer assembly 12. Therefore, the magnetic substrates 11A, 11B and the magnetic body 26 in FIG. 6 are omitted.

As shown in FIG. 6, the characteristic features of the common mode choke coil 400 are that the common mode choke coil 400 has a three-layer layer assembly 12, and that the third and fourth coil conductors 18, 19 are both formed on the second insulation layer 15B. The first coil conductor 16 is formed on the first insulation layer 15A, the second coil conductor 17 is formed on the second insulation layer 15B, and the first contact conductor 20 and the second contact conductor 21 are formed on the third insulation layer 15C. Since the other structural aspects are the same as in first embodiment, the same symbols are used to refer to the constituent elements that are the same in both embodiments, and no detailed description thereof will be given. According to the present embodiment, the third and fourth coil conductors 18, 19 can be formed simultaneously using the same mask, and the third and fourth coil conductors 18, 19 can therefore be formed so as to have the same shape, the same thickness, and left-right symmetry.

A signal transmission system to which the common mode choke coils 100 through 400 are applied will next be described.

Figure 7:
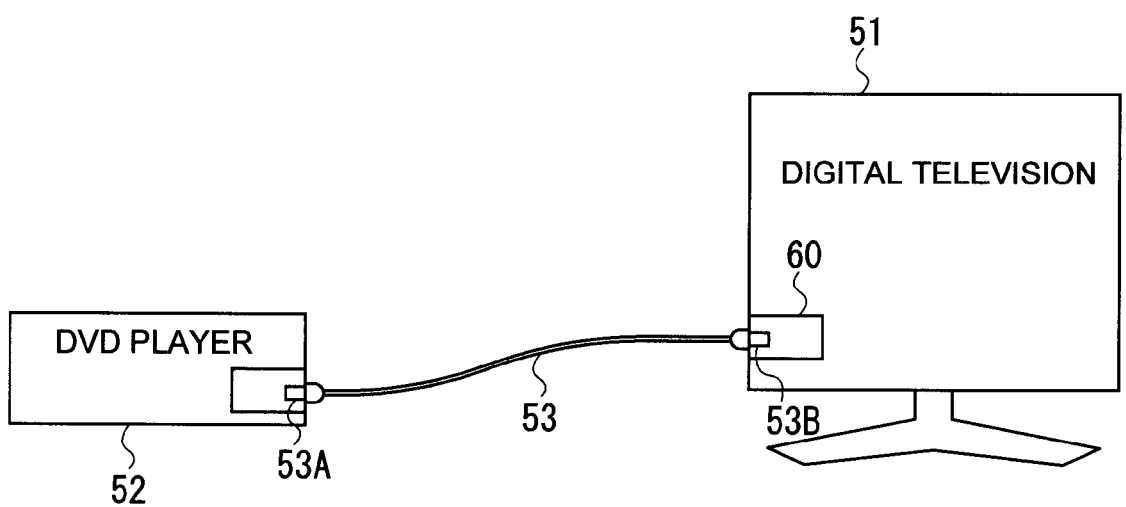
FIG. 7 is a schematic diagram showing an example of a signal transmission system in which a common mode choke coil is applied.

FIG. 7 is a schematic diagram showing an example of a signal transmission system in which a common mode choke coil is applied.

As shown in FIG. 7, a digital television 51 and a DVD player 52 are connected via an HDMI cable 53. The HDMI cable 53 is a cable that uses a differential transmission system, and is provided with plugs 53A, 53B. One plug 53A of the HDMI cable 53 is connected to an input-output part via an HDMI terminal of the DVD player 52, and the other plug 53B is connected to an input-output part via an HDMI terminal of the digital television 51. A digital signal outputted from the DVD player 52 is transmitted at high speed to the digital television 51 through the HDMI cable 53. A signal transmission circuit 60 is provided to the input-output part of the digital television 51 and the DVD player 52, and signal line noise removal and other processing is performed by the signal transmission circuit 60.

Figure 8:
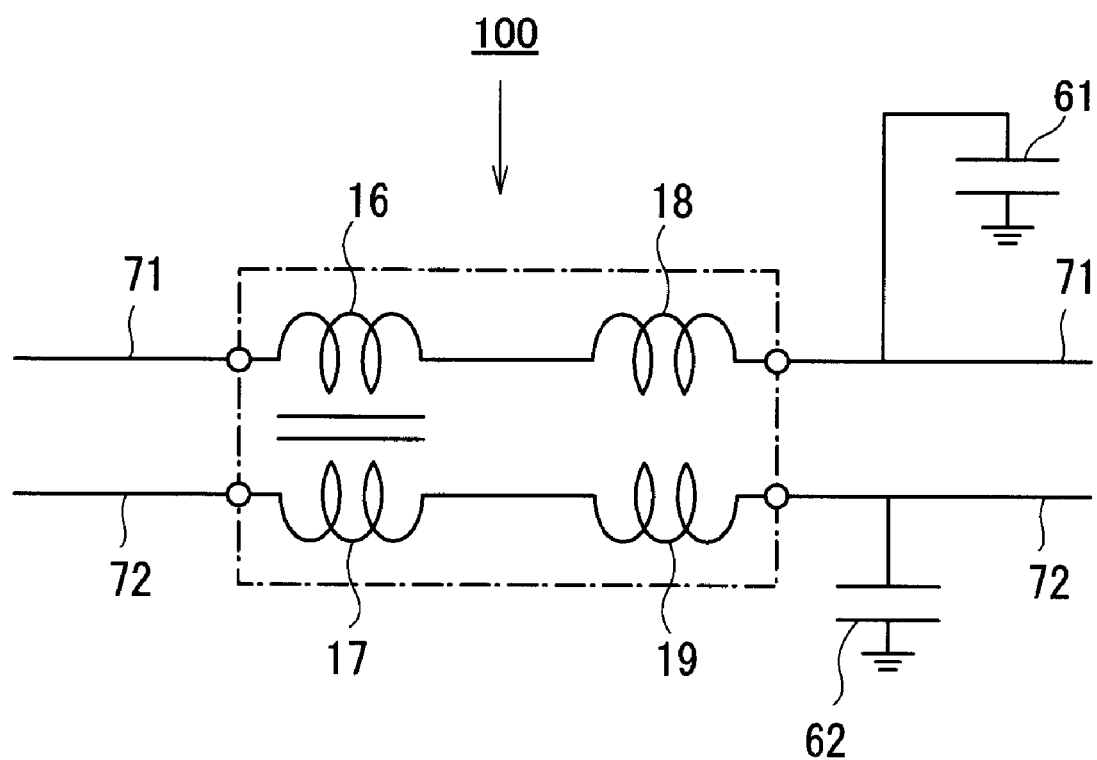
FIG. 8 is an equivalent circuit diagram showing a signal transmission circuit in which the common mode choke coil according to the first embodiment is applied.

FIG. 8 is an equivalent circuit diagram showing a signal transmission circuit in which the common mode choke coil 100 according to first embodiment is applied. The common mode choke coils 200 through 400 described in Embodiments 2 through 4 may also be applied instead of the common mode choke coil 100.

As shown in FIG. 8, varistors 61, 62 as ESD protection components are connected to a pair of signal lines 71, 72, respectively, that are included in the HDMI cable 53; and the common mode choke coil 100 is provided to a stage prior to the varistors 61, 62. The common mode choke coil 100 is preferably mounted so that the ends on one side of the first and second coil conductors 16, 17 face toward the HDMI cable 53, and the ends on one side of the third and fourth coil conductors 18, 19 face toward the internal circuit (toward the varistors). When the common mode choke coil 100 is mounted in this manner, common mode noise that is included in the input signal can be removed as soon as possible by the common mode choke coil composed of the first and second coil conductors 16, 17. The characteristic impedance adjustment coil can also be positioned near the varistors 61, 62.

Figure 9:
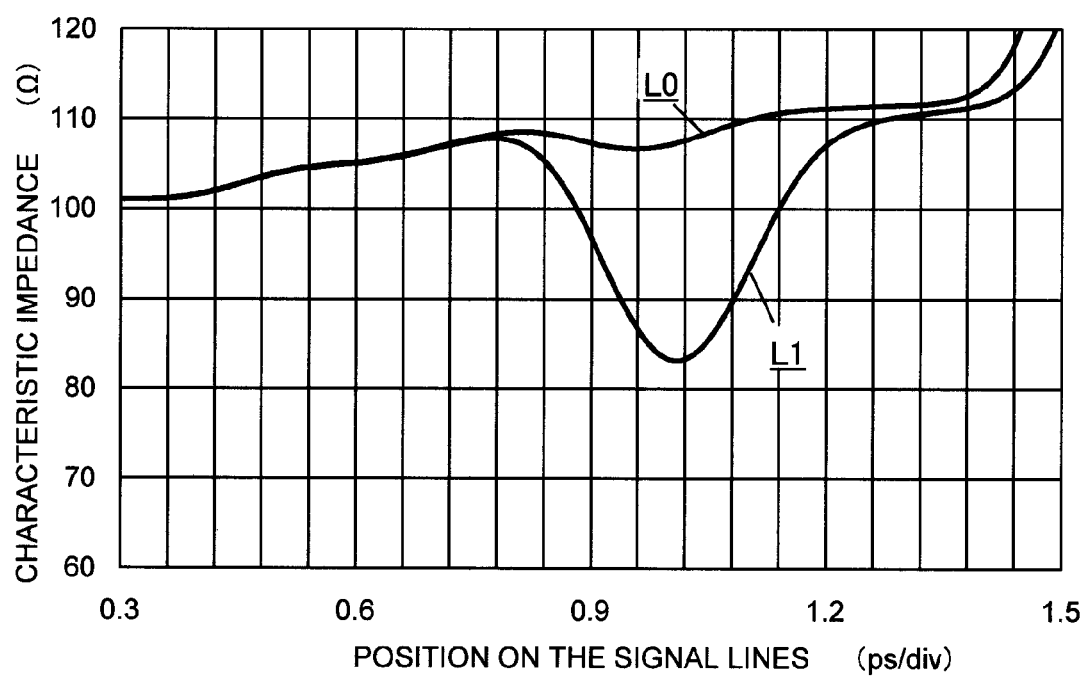
FIG. 9 is a graph showing the characteristic impedance of a pair of signal lines to which varistors are connected.

FIG. 9 is a graph showing the characteristic impedance of the pair of signal lines to which the varistors are connected, wherein the horizontal axis indicates the position on the signal lines (ps/div), and the vertical axis indicates the characteristic impedance ($\Omega$).

As shown in FIG. 9, the characteristic impedance (graph L0) of the pair of signal lines to which the varistors are not connected is about 100 ($\Omega$), and is generally uniform throughout the measurement range, but the characteristic impedance (graph L1) of the pair of signal lines to which the varistors are connected sharply decreases at the varistors connection position. It is thus apparent that a varistor or other capacitive element causes a significant decrease in the characteristic impedance.

Figure 10:
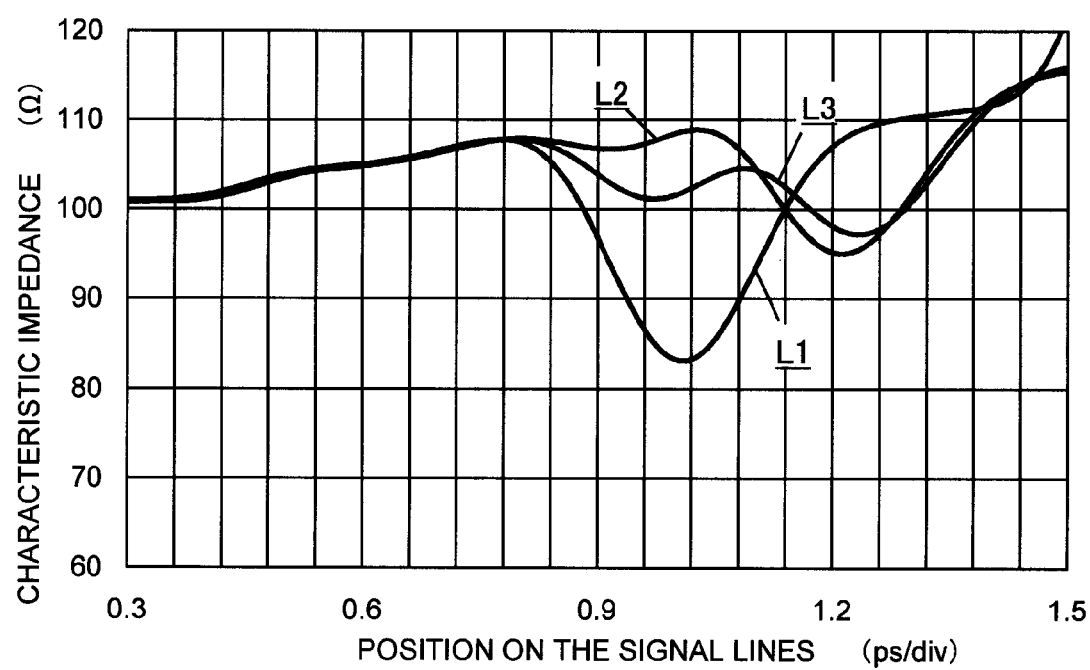
FIG. 10 is a graph showing the characteristic impedance when the common mode choke coil according to the present invention is inserted in a pair of signal lines to which varistors are connected.

FIG. 10 is a graph showing the characteristic impedance when the common mode choke coil according to the present invention is inserted in a pair of signal lines to which varistors are connected. In this diagram, graph L1 indicates the characteristic impedance (i.e., L1 of FIG. 9) when the common mode choke coil is not inserted, graph L2 indicates the characteristic impedance when the common mode choke coil is connected (forward connection) in the orientation shown in FIG. 8, and graph L3 indicates the characteristic impedance when the common mode choke coil is connected (backward connection) in the opposite orientation from that shown in FIG. 8.

As shown in FIG. 10, when the common mode choke coil is connected to a pair of signal lines in which varistors are connected, a sharp reduction of the characteristic impedance is apparently suppressed regardless of whether the common mode choke coil is connected in the forward direction or the reverse direction. It is apparent that the suppression of impedance reduction is greater when the common mode choke coil 100 is connected in the forward direction than in the reverse direction. This means that the characteristic impedance adjustment coil is preferably positioned close to the varistors.

As described above, reduction of the characteristic impedance by the first and second varistors 61, 62 can be suppressed when the common mode choke coil 100 is inserted in a stage prior to the first and second varistors 61, 62. The signal outputted from the DVD player 52 is also inputted to the digital television 51 through the HDMI cable 53 and the signal transmission circuit 60 almost without picking up any external noise. High-speed, high-quality digital transmission is therefore possible.

The present invention has thus been shown and described with reference to specific embodiments. However, it should be noted that the present invention is in no way limited to the details of the described arrangements but changes and modifications may be made without departing from the scope of the appended claims.

For example, a so-called thin-film-type common mode choke coil manufactured using a thin-film molding technique was described as an example in the embodiments, but the present invention is not limited to a thin-film type, and may be a so-called laminate-type common mode choke coil that is manufactured using a printing technique.

What is claimed is:

1. A common mode choke coil comprising:
   first and second coil conductors that are magnetically coupled to each other;
   a third coil conductor that is electrically connected in series to the first coil conductor and substantially not magnetically coupled to the first coil conductor;
   a fourth coil conductor that is electrically connected in series to the second coil conductor and substantially not magnetically coupled to the second coil conductor;
   a first contact conductor of which one end is connected to an inner end of the first coil conductor and the other end is connected to an inner end of the third coil conductor; and
   a second contact conductor of which one end is connected to an inner end of the second coil conductor and the other end is connected to an inner end of the fourth coil conductor, wherein
   the inner end of the first coil conductor and the inner end of the second coil conductor are formed so as not to overlap each other in view of an accumulating direction of the first and second coil conductors, the first contact conductor and the second contact conductor are formed so as not to overlap each other in view of the accumulation direction, and the third coil conductor and the fourth coil conductor are substantially not magnetically coupled.

2. The common mode choke coil as claimed in claim 1, wherein the first contact conductor and the second contact conductor are in a symmetrical based on a prescribed center line.

3. The common mode choke coil as claimed in claim 1, wherein the first contact conductor and the second contact conductor are provided in the same layer.

4. The common mode choke coil as claimed in claim 1, wherein the third coil conductor and the fourth coil conductor are provided in the same layer.

5. The common mode choke coil as claimed in claim 4, wherein one of the first and second coil conductors is provided in the same layer as the third and fourth coil conductors.

6. The common mode choke coil as claimed in claim 1, wherein a shortest distance between the third coil conductor and the fourth coil conductor is set to three or more times a pitch of the third and fourth coil conductors.

7. The common mode choke coil as claimed iii claim 1, wherein a width of the second coil conductor is less than a width of the first coil conductor.

8. The common mode choke coil as claimed in claim 1 further comprising a directional mark formed on a side surface of the common mode choke coil.

9. The common mode choke coil as claimed in claim 8, wherein the directional mark is a conductor pattern that is provided in the same layer as any of the first through fourth coil conductors and the first and second contact conductors.

10. The common mode choke coil as claimed in claim 1, wherein widths of the third and fourth coil conductors are less than widths of the first and second coil conductors.

11. A common mode choke coil comprising:
    first and second coil conductors that are magnetically coupled to each other;
    a third coil conductor connected to an inner end of the first coil conductor;
    a fourth coil conductor connected to an inner end of the second coil conductor a first contact conductor for connecting the third coil conductor with the inner end of the first coil conductor;
    a second contact conductor for connecting the fourth coil conductor with the inner end of the second coil conductor,
    first and second terminal electrodes;
    a first extraction conductor for connecting the first terminal electrode with an outer end of the first coil conductor, and
    a second extraction conductor for connecting the second terminal electrode with an outer end of the second coil conductor,
    wherein the first contact conductor is formed on a different layer from which the first coil conductor is formed, and the second contact conductor is formed on a different layer from which the second coil conductor is formed.

12. The common mode choke coil as claimed in claim 11, wherein the first extraction conductor is formed on the same layer on which the first coil conductor is formed, and the second extraction conductor is formed on the same layer on which the second coil conductor is formed.

13. A common mode choke coil comprising:
    a first coil conductor formed on a first layer;
    a second coil conductor formed on a second layer so as to overlap the first coil conductor;
    a third coil conductor formed on one of the first and second layer, the third coil conductor being connected to the first coil conductor via a first contact conductor; and
    a fourth coil conductor formed on one of the first and second layer, the fourth coil conductor being connected to the second coil conductor via a second contact conductor;
    wherein the first contact conductor is formed on a layer different from the first layer, and the second contact conductor is formed on a layer different from the second layer,
    wherein the third coil conductor is connected to an inner end of the first coil conductor via the first contact conductor and the fourth coil conductor connected to an inner end of the second coil conductor via the second contact conductor, and a magnetic coupling between an outer end of the first coil conductor and an outer end of the second coil conductor is weaker than a magnetic coupling between the inner end of the first coil conductor and the inner end of the second coil conductor.

14. The common mode choke coil as claimed iii claim 1, wherein a magnetic coupling between an outer end of the first coil conductor and an outer end of the second coil conductor is weaker than a magnetic coupling between the inner end of the first coil conductor and the inner end of the second coil conductor.

15. The common mode choke coil as claimed in claim 1, wherein the third coil conductor and the fourth coil conductor are in a symmetrical based on a prescribed center line.

16. The common mode choke coil as claimed in claim 11, wherein a magnetic coupling between an outer end of the first coil conductor and an outer end of the second coil conductor is weaker than a magnetic coupling between the inner end of the first coil conductor and the inner end of the second coil conductor.

* * * * *